United States Patent [19]

Jensen

[11] 4,180,892

[45] Jan. 1, 1980

[54] METHOD FOR THE MANUFACTURE OF A FORCE TRANSDUCER

[75] Inventor: Jorgen Jensen, Gentofte, Denmark

[73] Assignee: Bruel & Kjaer Industri A/S, Naerum, Denmark

[21] Appl. No.: 897,373

[22] Filed: Apr. 18, 1978

[51] Int. Cl.² ............................................. H01L 41/22
[52] U.S. Cl. ..................................... 29/25.35; 29/416; 29/418; 310/333
[58] Field of Search ....................... 29/25.35, 418, 416; 310/329, 333

[56] References Cited

U.S. PATENT DOCUMENTS

| | | | |
|---|---|---|---|
| 2,704,882 | 3/1955 | Olson | 29/418 X |
| 3,727,084 | 4/1973 | Epstein | 310/329 |

*Primary Examiner*—Carl E. Hall

*Attorney, Agent, or Firm*—Strauch, Nolan, Neale, Nies & Kurz

[57] ABSTRACT

A method for the manufacture of a force transducer consisting of a base carrying a stud which carries a set of shear sensitive elements, each having a seismic or force transmitting mass attached to it, the masses being fixed to shear sensitive elements fixed to the stud by means of a cylindrical spring clip surrounding the force transmitting masses and supplying elastic force through the elements to be fixed to the stud, the method involving cutting of slots which are parallel to the axis of the rod with a depth greater than the height of the shear sensitive elements, insertion of shear sensitive elements into the slots, pressing of a cylindrical spring clip around the slotted part of the rod, and cutting radially into the rod so as to remove the material making up the bottom of said slots.

1 Claim, 12 Drawing Figures

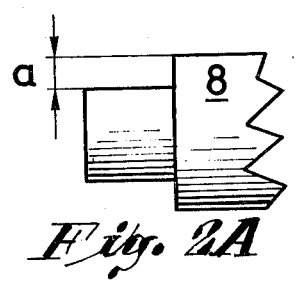
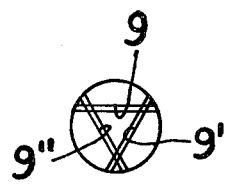
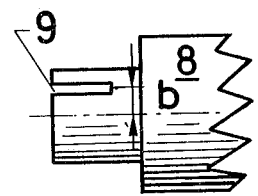
Fig. 2A  Fig. 2B  Fig. 2C
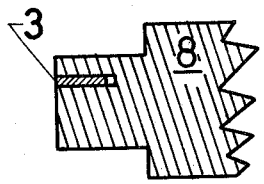
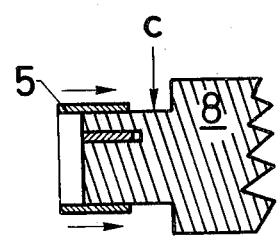
Fig. 2D  Fig. 2E
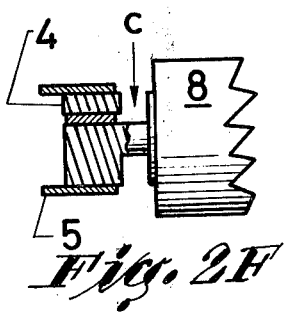
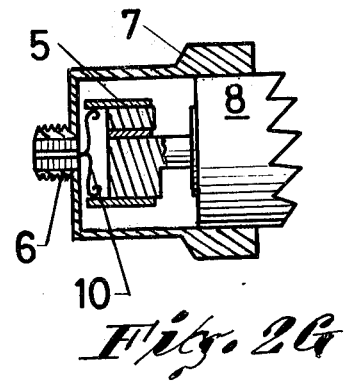
Fig. 2F  Fig. 2G
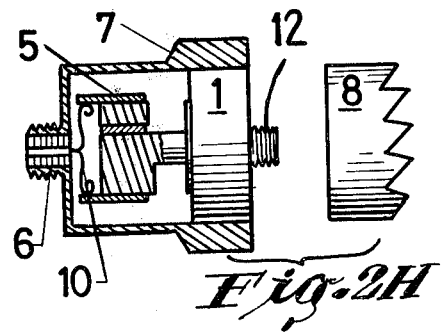
Fig. 2H

METHOD FOR THE MANUFACTURE OF A FORCE TRANSDUCER

BACKGROUND OF THE INVENTION

The invention concerns a procedure for the manufacture of a force transducer of a material supplied in one piece as a rod. The force transducer consists of a base carrying a stud which carries a set of shear sensitive elements, each having a seismic or force transmitting mass associated with it, the masses being fixed to the shear sensitive elements and the shear sensitive elements being fixed to the stud by means of a cylindrical spring clip surrounding the seismic or force transmitting masses and supplying elastic force through the elements to be fixed to the stud. A case carrying a plug for electrical connection is fixed to the base. Force transducers of the kind described and used as accelerometers have been known for long and have many attractive features such as low temperature coefficient and low transverse sensitivity. The disadvantage inherent in this construction has been the cost of production which furthermore rose in inverse proportion to the size of the accelerometer. Thus several instances are known where their use has been impossible through prohibitive cost. The production costs are mainly those of manual assembly as the parts may be efficiently produced on suitable machine tools.

It is a purpose of the invention to indicate a new manner of manufacture of a force transducer of the kind described above, which manner involves a minimum of manipulation. This is obtained through the new manner of manufacture which comprises the following steps in the tooling of the rod material:

(1) the cutting of slots which are parallel to the axis of the rod and having a depth which is greater than the height of the shear sensitive elements,
(2) the insertion of the shear sensitive elements into said slots,
(3) the pressing of the cylindrical spring clip around the slotted part of the rod,
(4) cutting radially into the rod so as to remove the material making up the bottom of said slots.

The steps enumerated are well suited for being performed on an automatic lathe with attachments.

The invention is to be described in detail in the following with reference to a particular force transducer, namely an accelerometer which is used as an example of the kind of force transducer intended. Reference is made to the drawing, in which:

FIGS. 2A through 2H illustrate the various stages of manufacture of a force transducer in accord with the present invention.

Figure 1A:
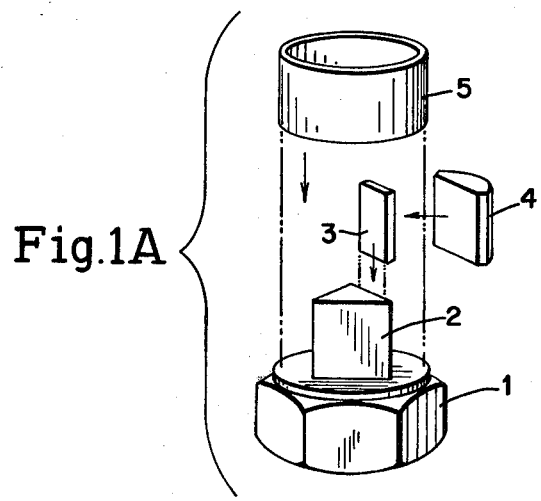
FIG. 1A shows a exploded perspective view of the component parts of an accelerometer that may be manufactured either by known techniques or by the new technique taught by the present invention.
Figure 1B:
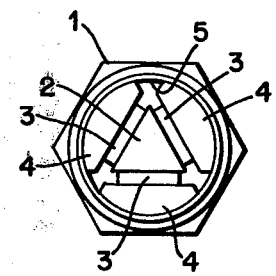
FIG. 1B is a top view of an assembly of the components shown in FIG. 1A.
Figure 1C:
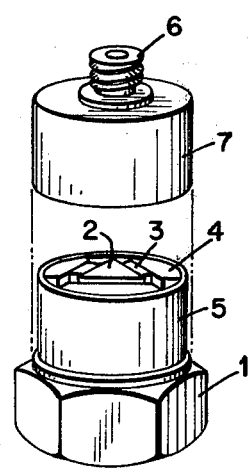
FIG. 1C is an exploded perspective view of the assembled components of FIG. 1A plus the cover member.
Figure 1D:
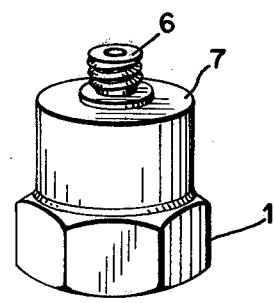
FIG. 1D is a perspective view of the completely assembled accelerometer of FIG. 1C.

In FIGS. 1A-1C the base 1 of the accelerometer is in one piece with a stud 2. A shear sensitive piezoelectric element 3 is disposed between the side of the stud 2 and a seismic mass 4. As there are three sets of piezoelectric element 3 and seismic mass 4 at 120° from each other, the whole assembly may be be kept in place by means of a spring clip 5 in FIGS. 1C and 1D, the cover 7 is pressed onto the base 1 and may contain a coaxial plug 6 having not shown contact fingers which establish contact with the spring clip 5 or the seismic masses 4.

The technique used up to the present invention for the manufacture of the accelerometer as described above was the following:

The base 1 with stud 2 is turned and milled from a piece of rod material. The shoulder for the cover 7 is turned and a hexagonal prism for a spanner is milled out of the base. The base is cut off from the rod 8 leaving a nipple which is subsequently threaded. The seismic masses 4 are obtained by milling, sawing, and grinding a second rod material. The piezoelectric elements 3 are temporarily fixed to the stud 2 and the seismic masses 4 are temporarily fixed to the piezoelectric elements. In a suitable jig the spring clip 5 is pressed onto the temporary assembly. Lastly a cover 7 which has been prepared separately with coaxial plug 6 is pressed onto the recessed base 1. The technique described involves a considerable amount of manual assembly work which is particularly difficult in case the piezo-electric elements and the seismic masses have very small dimensions, such as is the case when the accelerometer is designed for a high upper frequency limit. According to the invention the alternative and advantageous technique is as follows with reference to FIGS. 2A through 2H:

On an automatic lathe with associated tools the rod 8 is turned down to a diameter a which is suitable for the inside diameter of the cover 7. As shown at FIGS. B and C three slots 9, 9' and 9" (for simplicity, only one slot 9 is shown in FIGS. 2C through 2H) are cut axially in a distance b from the axis of the rod. The depth of the cuts is somewhat larger than the height of the piezoelectric elements 3. At FIG. 2D it is shown how one of the piezoelectric elements 3 is mounted in the slot 9 by pressing axially. At FIG. 2E it is shown how the spring clip 5 which has a continuous cylindrical surface is pressed down so that its rightmost (in the figure) end is at the same axial position as the piezoelectric elements 3. At FIG. 2F it is shown that the bottoms of the slots 9 are removed by cutting at c to a suitable depth. Thus the remaining pieces 4 become the seismic masses in the accelerometer when finished. The seismic masses and the piezoelectric elements are now only held in place by means of the spring clip 5. In this manner a correct mounting of the various parts of an accelerometer has been obtained without involving manual work. The cover 7 which has been manufactured beforehand in a way not specified as it has no bearing on the invention is pressed onto the rod 8 as shown at FIG. 2G. In this way the contact spring 10 makes contact with the spring clip 5 and constitutes the centre connector of the coaxial plug 6 while the outer connector is made of the cover 7. The rod is cut at the rear end of the cover 7 and a threaded nipple 12 is cut, and the finished accelerometer is cut free from the rod as shown at FIG. 2H.

Above, the new manner of manufacture according to the invention has been described with reference to an accelerometer having three piezoelectric elements. There is, however, nothing that would prevent its use with e.g. two or a greater number of elements, it will only influence the geometry of the axial slots.

It is evident that althogh the invention has been disclosed with reference to an accelerometer, it is by no means limited to those, it may with equal advantage be applied to the manufacture of any force transducer of the construction described.

I claim as my invention:

1. A method for the manufacture of a force transducer of a material supplied in rod form, which force transducer consists of a base carrying a stud which carries a set of shear sensitive elements, each having a seismic or force transmitting mass attached to it, the masses being fixed to the shear sensitive elements, and the shear sensitive elements being fixed to the stud by means of a cylindrical spring clip surrounding the seismic or force transmitting masses and supplying elastic force through the elements to be fixed to the stud, a cover fixed to the base and carrying a plug for electrical connection to the shear sensitive elements, which method for manufacture comprises the following steps:

(1) the cutting of slots which are parallel to the axis of the rod and having a depth which is greater than the height of the shear sensitive elements, (2) the insertion of the shear sensitive elements into said slots, (3) the pressing of the cylindrical spring clip around the slotted part of the rod, and (4) cutting radially into the rod so as to remove the material making up the bottom of said slots, the steps to be taken in the order given.

* * * * *